US008694569B2

(12) United States Patent
Willson, Jr. et al.

(10) Patent No.: US 8,694,569 B2
(45) Date of Patent: Apr. 8, 2014

(54) HIGH-SPEED SYSTEM HAVING COMPENSATION FOR DISTORTION IN A DIGITAL-TO-ANALOG CONVERTER

(75) Inventors: Alan N. Willson, Jr., Pasadena, CA (US); Tzu-Chieh Kuo, Irvine, CA (US)

(73) Assignee: Pentomics, Inc., Pasadena, CA (US)

( * ) Notice: Subject to any disclaimer, the term of this patent is extended or adjusted under 35 U.S.C. 154(b) by 1284 days.

(21) Appl. No.: 12/233,422

(22) Filed: Sep. 18, 2008

(65) Prior Publication Data

US 2009/0075595 A1    Mar. 19, 2009

Related U.S. Application Data

(60) Provisional application No. 60/960,158, filed on Sep. 18, 2007.

(51) Int. Cl.
*H03H 17/02* (2006.01)
*G06F 17/10* (2006.01)

(52) U.S. Cl.
USPC ............................................. 708/306; 708/319

(58) Field of Classification Search
CPC ............ H03H 17/026; H03H 17/0267; H03H 17/0273; H03H 17/0275
USPC .................. 708/306, 308, 316, 319
See application file for complete search history.

(56) References Cited

U.S. PATENT DOCUMENTS

| 4,454,486 | A | | 6/1984 | Hassun et al. |
| 4,521,867 | A | * | 6/1985 | Kasuga .......................... 708/320 |
| 6,621,366 | B1 | | 9/2003 | Gentile |
| 6,636,572 | B1 | * | 10/2003 | Staszewski .................... 375/354 |
| 7,747,666 | B2 | * | 6/2010 | Haddadin et al. ............. 708/313 |

OTHER PUBLICATIONS

H. Samueli, "The design of multiplierless FIR filters for compensating D/A converter frequency response distortion," IEEE Trans. Circuits and Systems, vol. 35, No. 8, pp. 1064-1066, Aug. 1988.
L. K. Tan, E. Roth, G. E. Yee, and H. Samueli, "An 800-MHz quadrature digital synthesizer with ECL-compatible output drivers in 0.8μm CMOS," in Proc. IEEE International Solid-State Circuits Conf, Feb. 17, 1995, pp. 258-259.
M. Potkonjak, M. B. Srivastava, and A. Chandrakasan, "Efficient substitution of multiple constant multiplications by shifts and additions using iterative pairwise matching," in DAC-94, Proceedings of the 31st ACM/IEEE Design Automation Conference, pp. 189-194, 1994.
http://www.analog.com/UploadedFilesfData Sheets/AD9957.pdf, 2008.
T. G. Noll, "Carry-save arithmetic for high-speed digital signal processing," in Proc. IEEE International Symposium on Circuits and Systems, May 1990, pp. 982-986.
D. A. Parker and K. K. Parhi, "Low-area/power parallel FIR digital filter implementations," Journal of VLSI Signal Processing, vol. 17, pp. 7592, 1997.

* cited by examiner

*Primary Examiner* — Chuong D Ngo
(74) *Attorney, Agent, or Firm* — Sterne, Kessler, Goldstein & Fox P.L.L.C.

(57) ABSTRACT

A method and system for the design and implementation of an inverse-sinc function that can efficiently process signals produced by high-speed systems is presented. An integrated inverse-sinc module accepts multiple data streams that may result from parallel sub-systems and creates multiple outputs that can be interleaved to produce a sequence that has been filtered by an inverse-sinc function. The multiple-input, multiple-output system may be beneficially operated at a low data rate, such as the data rate used by each of the sub-systems.

28 Claims, 13 Drawing Sheets

$h_0 = 1-\tfrac{1}{4}, \ h_1 = -1/16, \ h_2 = 1/64, \ h_3 = -1/256$

NOTE: >>b means hard-wired b-bit right shift

HIGH-SPEED SYSTEM HAVING COMPENSATION FOR DISTORTION IN A DIGITAL-TO-ANALOG CONVERTER

CROSS-REFERENCE TO RELATED APPLICATIONS

This patent application claims the benefit of Provisional Patent Application No. 60/960,158, filed Sep. 18, 2007, entitled "High-Speed System Having Compensation for Distortion in a Digital-to-Analog Converter," which is incorporated herein by reference in its entirety.

FIELD OF THE INVENTION

The invention relates generally to digital filters. More specifically, the invention relates to inverse-sinc filters.

BACKGROUND

It is well known that digital-to-analog converters (DAC) introduce amplitude distortion into the frequency spectrum of a signal being converted. This property is described in H. Samueli, "The design of multiplierless FIR filters for compensating D/A converter frequency response distortion," *IEEE Trans. Circuits and Systems*, vol. 35, no. 8, pp. 1064-1066, August 1988 [Samueli], which is herein incorporated by reference in its entirety. Moreover, a commonly-employed remedy for this distortion is the preprocessing of the digital signal by a discrete-time transfer function before it enters the DAC. This transfer function performs an alteration of the input signal's frequency spectrum that approximates the opposite, or inverse, of the amplitude distortion operation the DAC performs, thereby tending to cancel the effects of the DAC distortion.

As further evidenced by Samueli, it is well known that the distortion introduced by a DAC can be described by a transfer function involving a sinc function in the following manner $$H_{D/A}(f) = \mathrm{sinc}(\pi f/f_s) e^{-j\pi f/f_s}$$

where $\mathrm{sinc}(x) = \sin(x)/x$ and $f_s = 1/T$ is the sampling rate of the DAC. The discrete-time transfer function that compensates for the DAC distortion is often referred to as an "inverse-sinc" function and is typically implemented by a simple system that takes the form of an FIR digital filter. It is common, therefore, to also find such a transfer function referred to as an inverse-sinc filter. The simple seven-tap linear-phase FIR filter shown in FIG. 2 depicts one exemplary implementation of an inverse-sinc filter. Further examples of inverse-sinc filters, including the filter of FIG. 2, are given in Samueli.

In application, inverse-sinc filters are often preceded by high-speed systems. One method of constructing certain high-speed digital systems, while employing digital technology that does not operate efficiently at the desired high speed, is to construct multiple copies of the digital system and operate them simultaneously, in parallel, at a lower speed. The outputs of these parallel systems are then interleaved with one another. Examples of such interleaved structures can be found in L. K. Tan, E. Roth, G. E. Yee, and H. Samueli, "An 800-MHz quadrature digital synthesizer with ECL-compatible output drivers in 0.8 μm CMOS," in *Proc. IEEE International Solid-State Circuits Conf.*, Feb. 17, 1995, pp. 258-259 [Tan]; R. Hassun and A. W. Kovalick, "Waveform synthesis using multiplexed parallel synthesizers," U.S. Pat. No. 4,454,486., Jun. 12, 1984 [Hassun]; and K. Gentile, "Parallel-process digital modulator structures and methods," U.S. Pat. No. 6,621,366 B1., Sep. 16, 2003 [Gentile], all of which are incorporated herein by reference.

In one example, the interleaving of two parallel systems' outputs can be performed by a digital multiplexer (MUX) having two inputs and a single output. The MUX output value is always one of the two input values, as determined by the 0/1 setting of an input control signal that is supplied to the MUX. By switching the control signal back and forth between 0 and 1 at a high frequency f, it becomes possible to interleave two systems' outputs, creating an output sequence at the high frequency f, while each of the two systems operates at the lower frequency f/2. Only the actual MUX circuitry needs to operate at the high frequency f.

Similarly, by operating four sub-systems in parallel, as described in Tan, and employing a four-to-one MUX, it becomes possible to create a system that interleaves the four sub-system outputs into a single output signal having a high-speed data rate f, while each sub-system operates at the four-times lower frequency f/4. The 4-to-1 MUX sequentially couples the four sub-system output signals to the output of the MUX and then repeatedly continues this sequential coupling.

The performance of an inverse-sinc filtering operation on a high-speed signal can be problematic. For example, consider a high-speed system that has been constructed by interleaving the outputs of multiple sub-systems, wherein the resulting high-speed digital signal created is supplied to a DAC. It appears necessary to build an FIR filter that operates at the high data rate of the interleaved signal, since it is not possible to do the filtering by including separate copies of the inverse-sinc filter within each of the sub-systems. That is, the filtering cannot be performed on each sub-system's individual output, since the interleaving (MUXing) of such filtered outputs would yield a quiet different result than the desired result—i.e., the filtering of the interleaved sequence.

In principle, a feed-forward system, such as an FIR filter, can be operated at an arbitrarily high data rate. It is well known that pipeline stages can be incorporated into a feed-forward system, and, by inserting enough such pipeline stages, virtually any desired high data rate can be achieved. However, the overhead cost of such high-speed pipeling hardware can be prohibitive. This cost can be expressed in terms of an increase in the system's power dissipation, an increase in integrated-circuit area, an increase in system complexity, and ultimately, actual monetary cost of system fabrication and/or operating cost.

What is therefore needed are new systems and methods for implementing inverse-sinc filters, or equivalents thereof, that can efficiently process signals produced by high-speed systems.

BRIEF DESCRIPTION OF THE DRAWINGS/FIGURES

Figure 1:
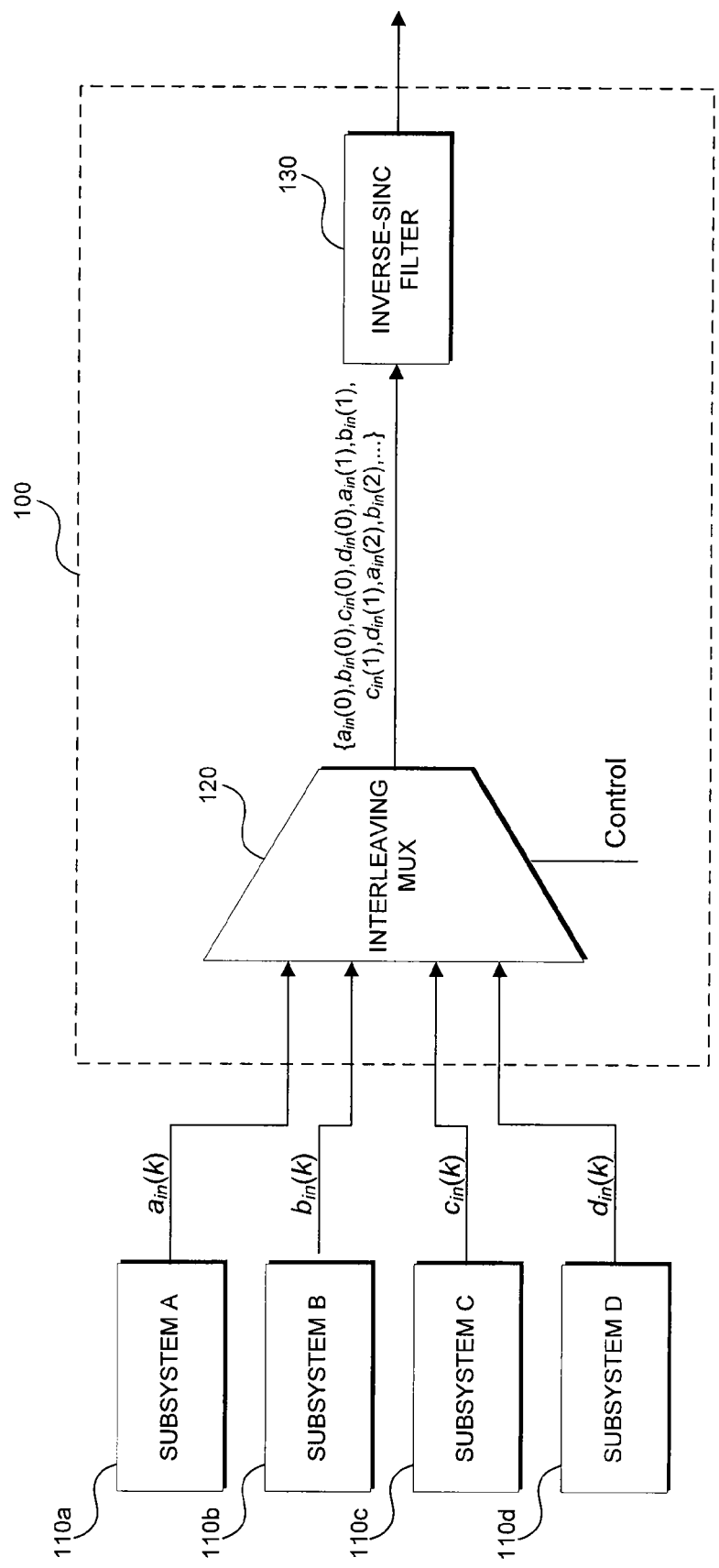
FIG. 1 depicts an exemplary conventional environment, where an inverse-sinc function is performed on a high data rate interleaved sequence.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment.

Further, when a particular feature, structure, or characteristic is described in connection with an embodiment, it is submitted that it is within the knowledge of one skilled in the art to affect such feature, structure, or characteristic in connection with other embodiments whether or not explicitly described.

Other embodiments are possible, and modifications may be made to the embodiments within the spirit and scope of the invention. Therefore, the detailed description is not meant to limit the invention. Rather, the scope of the invention is defined by the appended claims.

I. Overview

In order to overcome the difficulties discussed above, a system is presented herein that accepts multiple data streams that may result from parallel sub-systems and creates multiple outputs that can be interleaved in the usual manner (e.g., by using a MUX), with the resulting interleaved sequence then being one that will have been filtered by an inverse-sinc transfer function. The multiple-input, multiple-output system may be beneficially operated at a lower data rate, such as the data rate used by each of the sub-systems. Using the system presented herein, only the interleaving MUX needs to operate at a higher data rate. Exemplary embodiments of such a system, in accordance with the present invention, are described in further detail in Section II, below.

II. A Four-Input, Four-Output Example

For the sake of clarity, exemplary four-input, four-output embodiments of a module, in accordance with the present invention will be presented. It will be evident to one of ordinary skill in the art that the present invention may be extended to a much broader context and that such an extension is recognized as being intrinsic to the present invention. For example, a module in accordance with the present invention may be extended to include any number of inputs/outputs (e.g., M inputs/outputs) without departing from the scope of the present invention.

High-Speed System Implementing a Conventional Inverse-Sinc Filter

FIG. 1 depicts a conventional system 100, for performing an inverse-sinc function on an interleaved sequence. The interleaved sequence is generated from four, discrete-time input signals $a_{in}(k)$, $b_{in}(k)$, $c_{in}(k)$, and $d_{in}(k)$, where the integers k=0, 1, 2, . . . denote sample points of the discrete-time signals. The discrete-time input signals $a_{in}(k)$, $b_{in}(k)$, $c_{in}(k)$, and $d_{in}(k)$ are respectively generated by parallel subsystems 110a-d and interleaved by interleaving MUX 120. The resulting interleaved sequence, provided to inverse-sinc filter 130 is:

$$\{a_{in}(0),b_{in}(0),c_{in}(0),d_{in}(0),a_{in}(1),b_{in}(1),C_{in}(1),d_{in}(1),a_{in}(2),b_{in}(2),\ldots\}$$

As discussed above, inverse-sinc filter 130 may be required to operate at a high data rate compared to sub-systems 110a-d. For example, if sub-systems 110a-d are operating at a frequency f/4, inverse-sinc filter 130 may be required to operate at a frequency f—four times faster than the sub-systems—in order to process the interleaved sequence. In general, inverse-sinc filter 130 can be operated at an arbitrarily high data rate by incorporating known high-speed design techniques, such as pipelining. However, as further discussed above, the overhead cost of high-speed pipeling hardware can be prohibitive. This cost can be expressed in terms of an increase in the system's power dissipation, an increase in integrated-circuit area, an increase in system complexity, and ultimately, actual monetary cost of system fabrication and/or operating cost.

Integrated Inverse-Sinc Module

Figure 2:
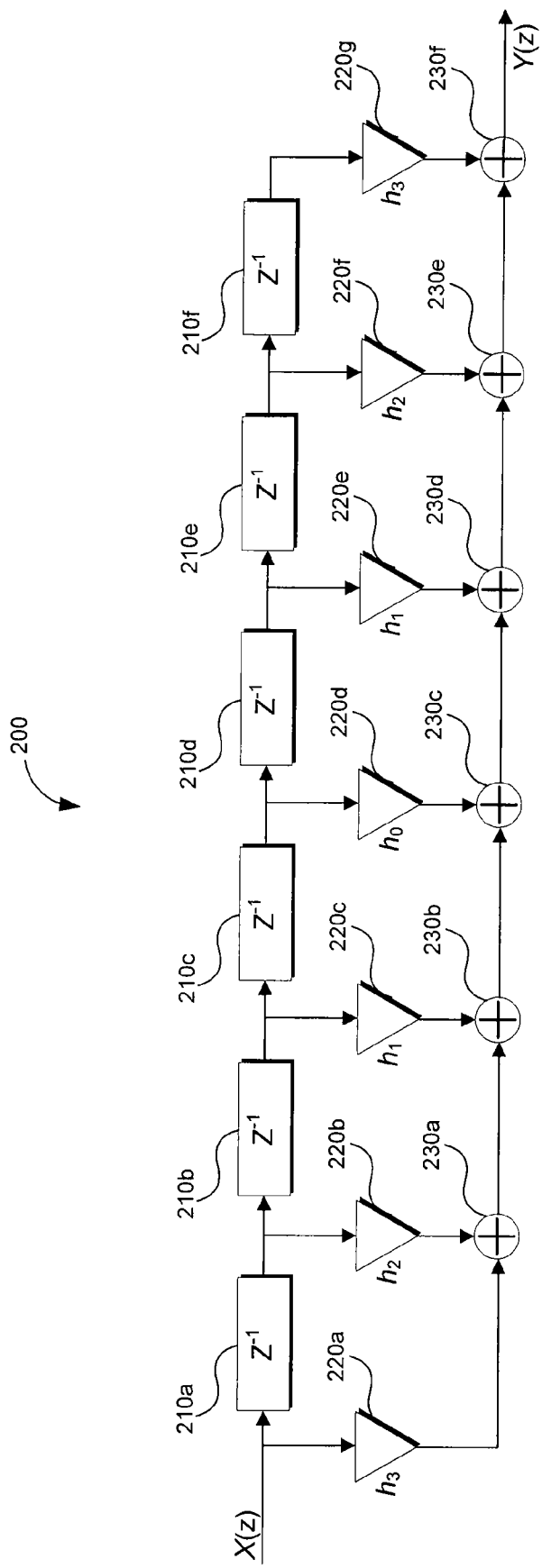
FIG. 2 depicts an exemplary structure for a simple seven-tap linear-phase FIR filter that performs inverse-sinc filtering.

FIG. 2 depicts an exemplary structure 200 for a conventional seven-tap inverse-sinc filter. In structure 200, the input samples are processed by unit-delays 210a-f, multipliers 220a-g, and adders 230a-f. The inverse-sinc filter of FIG. 2 can be described as $$Y(z)=H(z)X(z)=(h_3+h_2z^{-1}+h_1z^{-2}+h_0z^{-3}+h_1z^{-4}+h_2z^{-5}+h_3z^{-6})X(z)$$

where the tap coefficients are: $h_0=1\tfrac{1}{4}$, $h_1=-\tfrac{1}{16}$, $h_2=\tfrac{1}{64}$, $h_3=-\tfrac{1}{256}$.

In accordance with the present invention, the above specified transfer function can be "un-rolled" to create four consecutive terms of the interleaved sequence described above, as follows:

$$a_{out}(k)=h_3a(k)+h_2d(k-1)+h_1c(k-1)+h_0b(k-1)+h_1a(k-1)+h_2d(k-2)+h_3c(k-2)$$

$$b_{out}(k)=h_3b(k)+h_2a(k)+h_1d(k-1)+h_0c(k-1)+h_1b(k-1)+h_2a(k-1)+h_3d(k-2)$$

$$c_{out}(k)=h_3c(k)+h_2b(k)+h_1a(k)+h_0d(k-1)+h_1c(k-1)+h_2b(k-1)+h_3a(k-1)$$

$$d_{out}(k)=h_3d(k)+h_2c(k)+h_1b(k)+h_0a(k)+h_1d(k-1)+h_2c(k-1)+h_3b(k-1)$$

Figure 3:
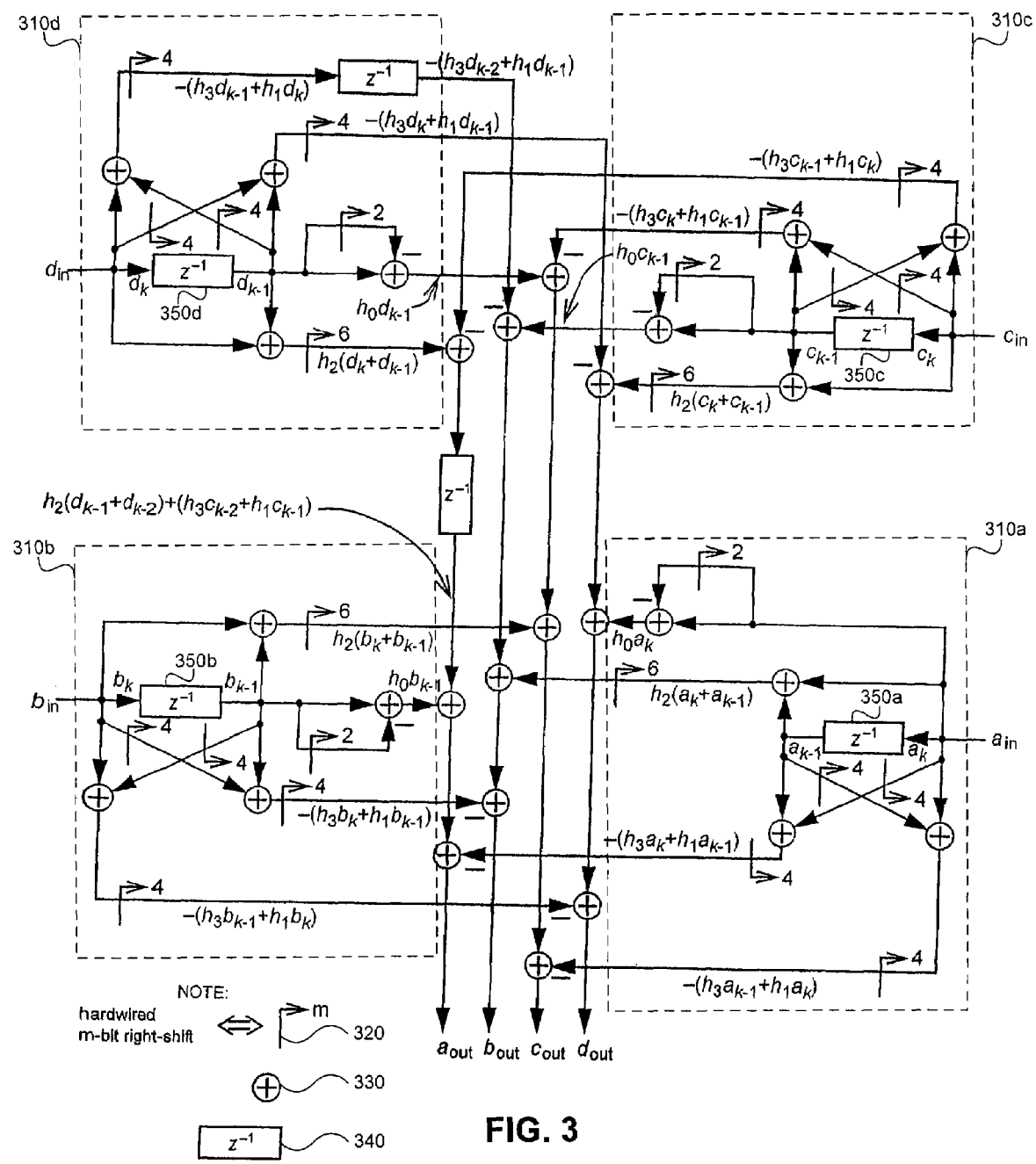
FIG. 3 depicts an exemplary embodiment of a four-input, four-output integrated inverse-sinc module, in accordance with the present invention.

FIG. 3 depicts an implementation of a four-input, four-output module 300, according to an embodiment of the present invention, whose inputs and outputs are governed by this set of four equations. The coefficient values are: $h_0=1\frac{1}{4}$, $h_1=-\frac{1}{16}$, $h_2=\frac{1}{64}$, $h_3=-\frac{1}{256}$.

Module 300 of FIG. 3 can be inserted into the overall system of FIG. 1 before the four-to-one interleaving operation (i.e., before MUX 120), replacing inverse-sinc filter 130. Module 300 can provide a very efficient embodiment to perform the computations needed to implement the desired inverse-sinc filtering, while having the ability to operate at a lower data rate, such as the data-rate of sub-systems 110a-d depicted in FIG. 1. Operating at a lower data rate can beneficially decrease system power dissipation, integrated-circuit area, system complexity, and ultimately, actual monetary cost of system fabrication and/or operating cost.

Module 300 is a single, integrated module (which may be referred to as an "integrated inverse-sinc module") that simultaneously processes the four discrete-time input signals $a_{in}(k)$, $b_{in}(k)$, $c_{in}(k)$, and $d_{in}(k)$, and simultaneously generates the four discrete-time outputs signals $a_{out}(k)$, $b_{out}(k)$, $c_{out}(k)$, and $d_{out}(k)$. The discrete-time output signals $a_{out}(k)$, $b_{out}(k)$, $c_{out}(k)$, and $d_{out}(k)$ are generated such that, when they are interleaved, the resulting interleaved sequence is equivalent to that produced by an inverse-sinc filter operating on an interleaved sequence of the discrete-time input signals $a_{in}(k)$, $b_{in}(k)$, $c_{in}(k)$, and $d_{in}(k)$.

Module 300 comprises four sub-modules 310a-d that are coupled to discrete-time input signals $a_{in}(k)$, $b_{in}(k)$, $c_{in}(k)$, and $d_{in}(k)$, respectively. Each sub-module 310a-d is configured to compute components for a plurality of the discrete-time output signals, based on the discrete-time input signal coupled to each respective sub-module 310a-d, using hard-wired right-shifts 320, adders 330, and delay elements 340. For example, sub-module 310a computes components $h_0a_k$, $h_2(a_k+a_{k-1})$, $-(h_3a_k+h_1a_{k-1})$, and $-(h_3a_{k-1}h_1a_k)$. Components provided by sub-modules 310a-d are combined by the adders 330 illustrated in respective columns in the center of module 300, to generate discrete-time output signals $a_{out}(k)$, $b_{out}(k)$, $c_{out}(k)$, and $d_{out}(k)$.

As further illustrated in FIG. 3, certain components provided by sub-modules 310a-d are advantageously created through sharing of a single delay element. For example, three of the components computed by sub-module 310a—$h_2(a_k+a_{k-1})$, $-(h_3a_k+h_1a_{k-1})$, and $-(h_3a_{k-1}+h_1a_k)$—are efficiently created through the sharing of a single delay element 350a. This could be viewed as a version of a commonly discussed technique for the efficient design of digital filters called "subexpression sharing", as described in M. Potkonjak, M. B. Srivastava, and A. Chandrakasan, "Efficient substitution of multiple constant multiplications by shifts and additions using iterative pairwise matching," in DAC-94, Proceedings of the 31st ACM/IEEE Design Automation Conference, pp. 189-194, 1994 [Potkonjak], which is herein incorporated by reference in its entirety. Single delay elements 350b-d are similarly shared in sub-modules 310b-d, respectively. In general, sharing of delay elements 350a-d integrates module 300 to form a single system, while reducing any one of hardware demands, area, power, and cost.

As noted above, module 300 may be included in the overall system of FIG. 1 before interleaving MUX 120 as a replacement for inverse-sinc filter 130. While it certainly may be the case that an interleaving MUX may immediately follow module 300, within the structure of a larger overall system, this need not be the case. Conceivably, some other lower data rate processing of the outputs of module 300—scaling, for example—might be inserted before performing the interleaving operation.

The configuration of module 300 requires just six delay elements 340 and 28 addition (or subtraction) operations 330. An adder (subtractor) 330 may be any one of a number of known types of adders, e.g., a carry-ripple adder, a carry-save adder, etc. Hard-wired bit shifts 320 are employed to implement power-of-two "multiplications" in a manner that will be understood by one having ordinary skill in the art(s). If the technology being employed does not easily accommodate the desired operating speed, pipeline registers may be added to the four-input, four-output design. This is a relatively minor change to the design of module 300, a change that is easily within the capabilities of one having ordinary skill in the art(s).

Refining Filter Coefficients

If other filter coefficients are desired, relatively minor changes can be made to module 300. For example, if the coefficients of the inverse-sinc filter shown in the current Analog Devices, Inc. datasheet for the AD9957 integrated circuit (referred to herein as "AD9957") are desired, it may suffice to add just four hard-wired shifts and four additions to module 300 of FIG. 3. This notion is based upon the following analysis:

First, the AD9957 inverse-sinc coefficients are normalized to values for which $h_0=0.75$ is exact. Then, in binary, the coefficients ($h_0=6729$, $h_1=-562$, $h_2=134$, $h_3=-35$) become:

$$h_0 = \text{dec2bin}(6729 \times 0.75/6729) = 0.11$$

$$h_1 = -\text{dec2bin}(562 \times 0.75/6729) = -0.0001000000001001001000010$$

$$h_2 = \text{dec2bin}(134 \times 0.75/6729) = 0.0000001111010010110011011$$

$$h_3 = -\text{dec2bin}(35 \times 0.75/6729) = -0.0000000011111111101010000$$

and thus, the normalized values are approximately (using binary numerical values):

$$h_0 = 0.11, \text{ exact}$$

$$h_1 = -0.0001 + e_1, \text{ where } -2^{-2} < e_1 < 0$$

$$h_2 = 0.000001000\bar{1} + e_2, \text{ where } 0 < e_2 < 2^{-11}$$

$$h_3 = -0.00000001 + e_3, \text{ where } 0 < e_3 < 2^{-17}$$

Here, the symbol $\bar{1}$ denotes a "signed bit," which is a bit having the same weight that a 1-bit would have at the same position in a given binary word, but whose contribution to the overall word's value is negative. Thus, for example, both of the binary words 0.11 and 1.0$\bar{1}$ represent 0.75 as a decimal equivalent.

Figure 4:
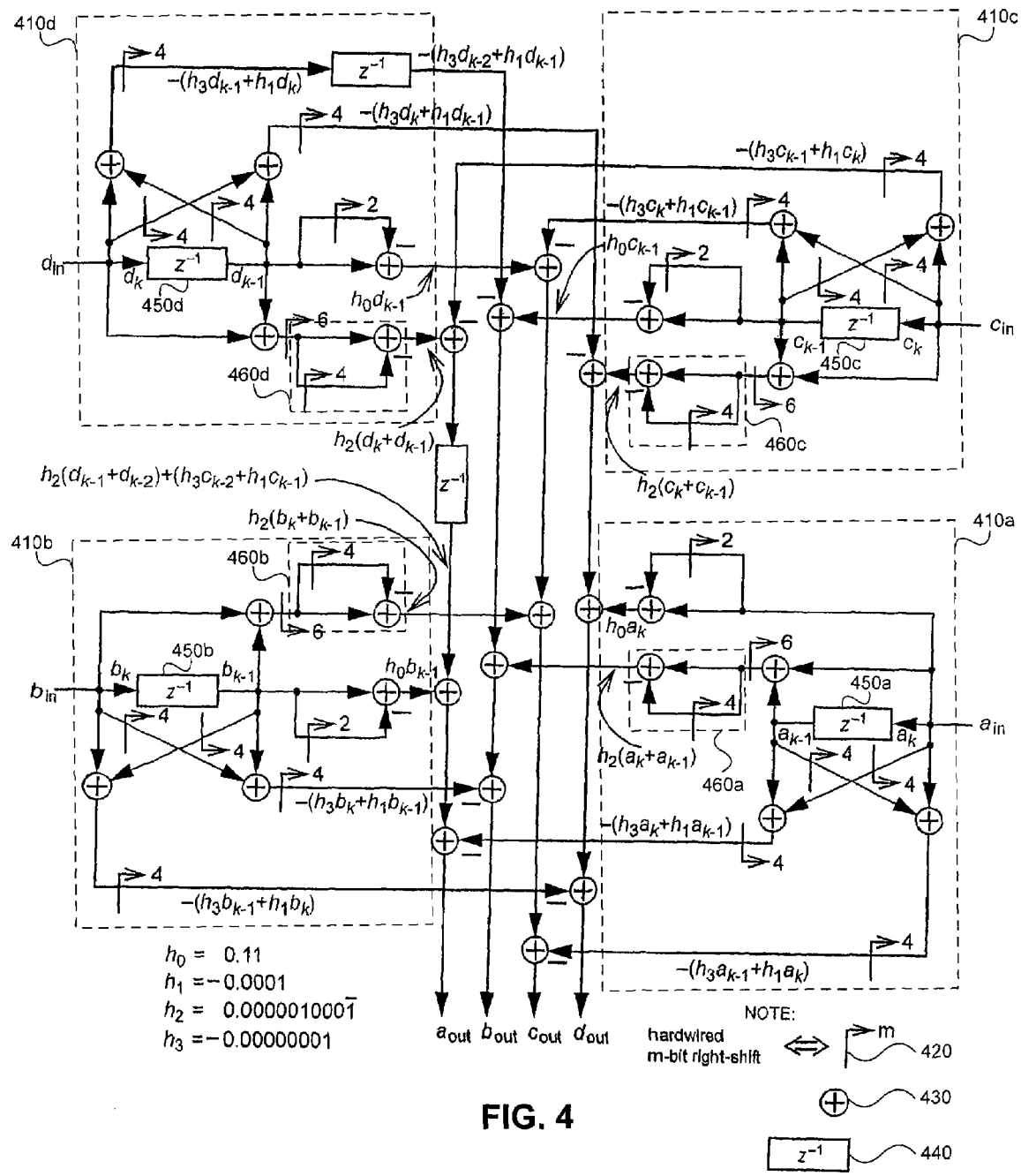
FIG. 4 depicts an exemplary embodiment of a four-input, four-output integrated inverse-sinc module employing refined filter-tap coefficients, in accordance with the present invention.

FIG. 4 depicts module 300 of FIG. 3 modified to use the AD9957 inverse-sinc coefficients. Specifically, coefficient refinement units 460a-d have been added to module 300 to form module 400, depicted in FIG. 4. Each coefficient refinement unit 460a-d includes one hard-wired right shift 420 and one adder (subtractor) 430.

Consider coefficient refinement unit 460b, which includes a four-bit, hard-wired right shift 420 and an additional adder 430. Coefficient refinement unit 460b is coupled to the portion of sub-module 410b that produces component value $h_2(b_k+b_{k-1})$. As noted above, coefficient $h_2$ has been modified from a value of 0.000001 (i.e., 1/64) to 0.0000010001 (i.e., 1/64–1/1024). In operation, coefficient refinement unit 460*b* receives the original component value (1/64)×($b_k$+$b_{k-1}$) and subtracts the value of (1/1024)×($b_k$+$b_{k-1}$), thereby accommodating the refinement. As will be evident to one of ordinary skill in the art, coefficient refinement units 460*a*, 460*c*, and 460*d* are configured to operate in a similar manner as coefficient refinement unit 460*b*.

It should be noted that other inverse-sinc filters may require an FIR filter with a different number of taps and/or may require the interleaving of a different number of sub-system signals (different than the examples discussed in FIGS. 3 and 4 having four sub-systems). It will be evident to one of ordinary skill in the art, similar structures can be employed to accommodate such changes, since the systems differ from one another by minor differences in detail. The number of equations may be different than four and a different number of delays and add/subtract operations may be required. Starting with the knowledge of the exemplary embodiments given explicitly herein, these details can be altered routinely by one having ordinary skill in the art.

For example, consider an inverse-sinc filter with the following transfer function:

$$H(z) = +h_1 + h_0 z^{-1} + h_1 z^{-2}.$$

The transfer function above has three taps, in contrast to the seven taps of inverse-sinc filter 200, which is depicted in FIG. 2 and used for exemplary purposes in the preceding examples. In addition, consider that three discrete-time input signals are provided, instead of four. Then, the resulting "un-rolled" equations would be:

$$a_{out}(k) = h_1 a(k) + h_0 c(k-1) + h_1 b(k-1)$$

$$b_{out}(k) = h_1 b(k) + h_0 a(k) + h_1 c(k-1)$$

$$c_{out}(k) = h_1 c(k) + h_0 b(k) + h_1 a(k)$$

Figure 5:
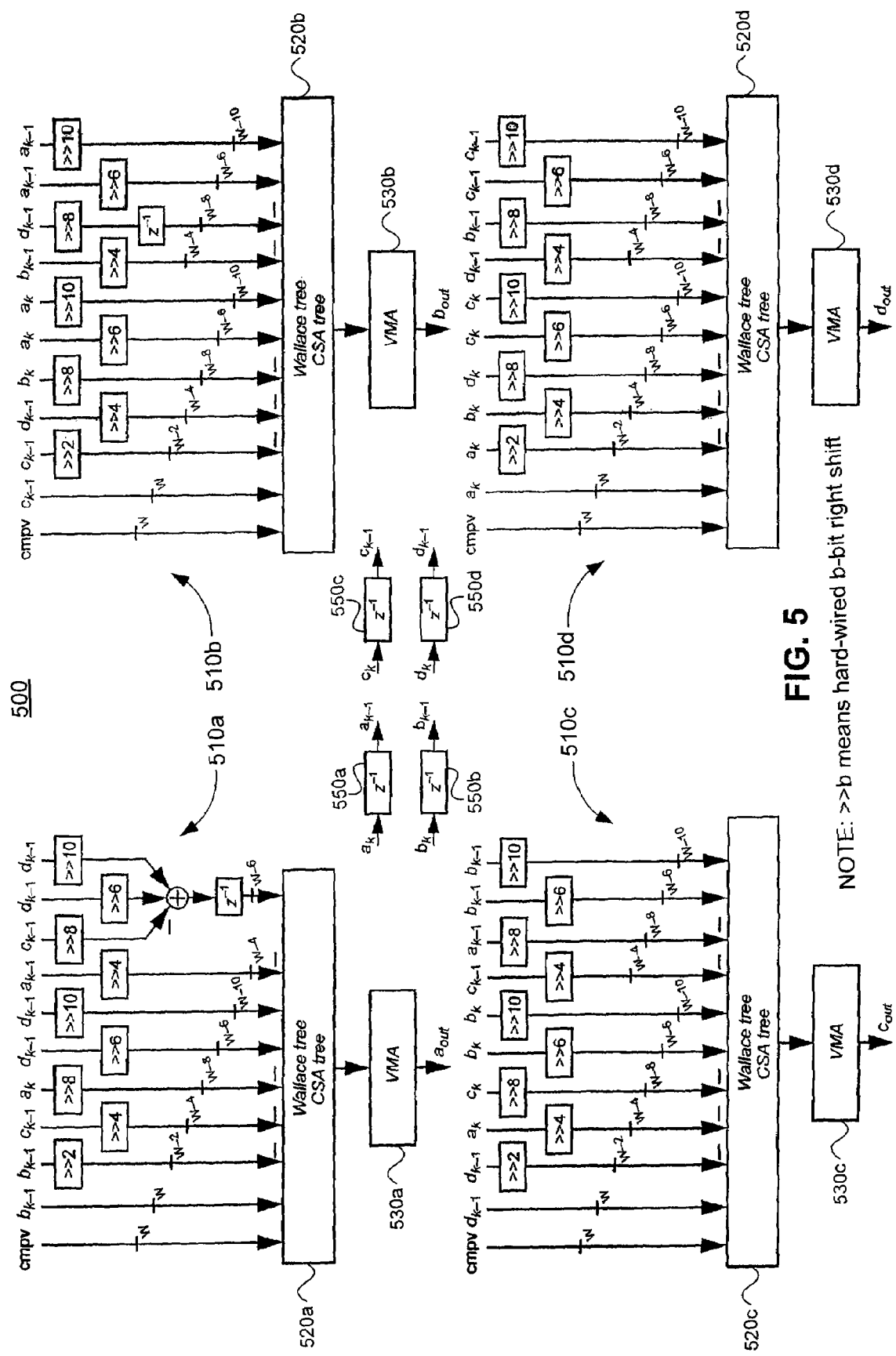
FIG. 5 depicts an alternate embodiment of a four-input, four-output integrated inverse-sinc module, in accordance with the present invention.

As will be evident to one of ordinary skill in the art, the embodiments of FIGS. 3, 4, and 5, can be altered accordingly to accommodate the resulting three equations above.

Alternate Forms for the Integrated Inverse-Sinc Module

FIG. 5 depicts an alternate implementation of module 400 illustrated in FIG. 4, according to embodiments of the present invention. While the FIG. 4 embodiment achieves a reduction in the total number of adders required due, in part, to its "sub-expression sharing," the embodiment of FIG. 5 is possibly preferable for high-speed implementations. Module 500 includes 4 sub-modules 510*a*, 510*b*, 510*c*, and 510*d* that provide respective discrete-time output signals $a_{out}(k)$, $b_{out}(k)$, $c_{out}(k)$, and $d_{out}(k)$. Each sub-module 510*a-d* is coupled to the discrete-time input signals $a_{in}(k)$, $b_{in}(k)$, $c_{in}(k)$, and $d_{in}(k)$.

Individually shifted versions of the input data, provided by discrete-time input signals $a_{in}(k)$, $b_{in}(k)$, $c_{in}(k)$, and $d_{in}(k)$, are summed up through Wallace trees or Carry-Save adder trees 520*a-d*. It should be noted that any adder tree may be used without departing from the scope of the present invention. Final vector merge adders (VMAs) 530*a-d* convert the redundant carry-save representations back to two's complement representations. Sign-extensions of the right-shifted inputs are eliminated by adding the constant-valued compensation vectors (labeled as "cmpv" in FIG. 5), and each summing term can therefore be represented with reduced word length. Overflow prevention for CSA arithmetic, as described in T. G. Noll, "Carry-save arithmetic for high-speed digital signal processing," in Proc. IEEE International Symposium on Circuits and Systems, May 1990, pp. 982-986 [Noll], which is herein incorporated by reference in its entirety, is also omitted as sub-expression sharing is not employed.

Notice that the four one-sample delay components 550*a-d*, shown at the center of FIG. 5, may play a key role in the processing of input data for all system outputs—showing that even in an embodiment that may look, at first, to be rather separated into four isolated components, the actual run-time computation involves a considerable amount of interaction among all parts of the structure, including, for example, the sharing of the common signal a(k-1), as this signal is provided to sub-components 510*a-c* that produce $a_{out}$, $b_{out}$ and $c_{out}$.

It is simple to further modify the system of FIG. 5 if, for example, more refined scaled approximations of the coefficient values ($h_0$=6729, $h_1$=−562, $h_2$=134, $h_3$=−35) are desired. This could be achieved by adding one more non-zero bit to the above described $h_1$ and $h_2$ values as follows:

$$h_1 = -0.0001000000001 + e_1, \text{ where } -2^{-15} < e_1 < 0$$

$$h_2 = 0.0000010010100 + e_2, \text{ where } 0 < e_2 < 2^{-14}.$$

Figure 6:
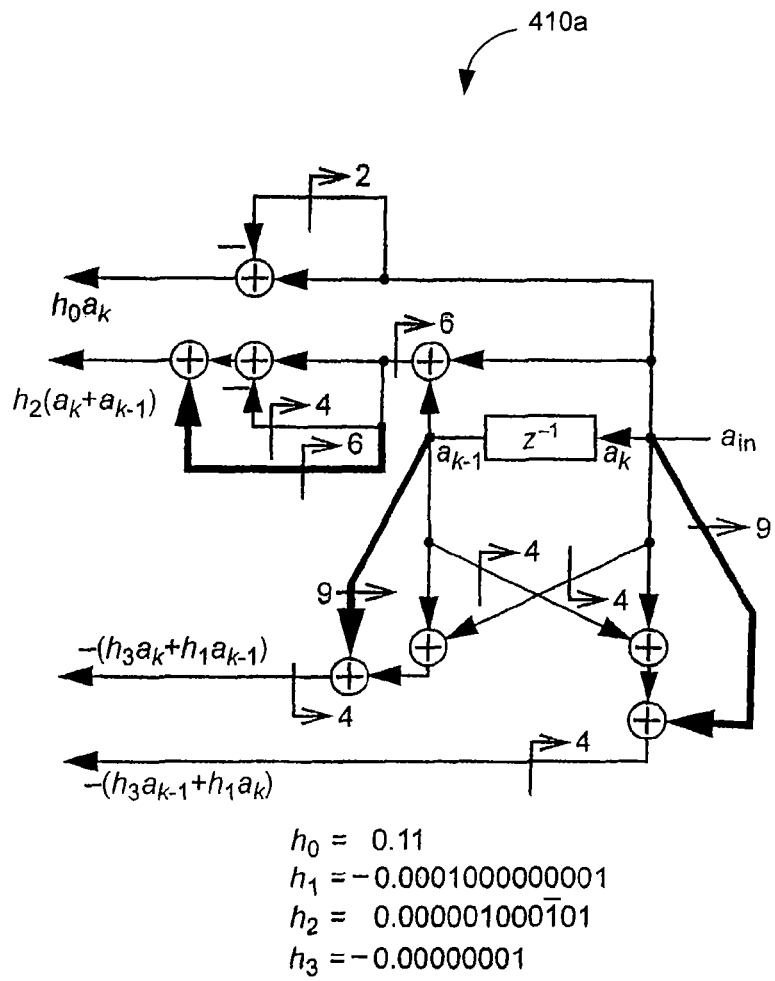
FIG. 6 depicts an embodiment of a sub-module of a four-input, four-output integrated inverse-sinc module employing filter-tap coefficients refined even further than the embodiment of FIG. 4, in accordance with the present invention.

These coefficients could be realized by several minor alterations to the FIG. 4 system of the sort illustrated in FIG. 6. FIG. 6 depicts sub-module 410*a* of FIG. 4 with minor alterations (shown in bold) that further refine the scaled approximations of the coefficient values ($h_0$=6729, $h_1$=−562, $h_2$=134, $h_3$=−35). Similar alterations could be realized to the embodiment depicted in FIG. 5 by introducing several additional shifted entries into the inputs of the adder trees.

An Example Application

In the U.S. Utility patent application Ser. No. 11/938,252, filed Nov. 9, 2007, the subject matter of which is incorporated herein by reference, and entitled "Efficient Angle Rotator Configured for Dynamic Adjustment," a system is discussed having the general form depicted by system 700 of FIG. 7. System 700 includes read-only memory (ROM) 710, coarse stage 720, fine stage 730, and coarse-stage scaling circuit 740.

In operation, system 700 accepts two digital words, labeled "I" and "Q", as well as a radian-dimensioned angle θ that may be specified in a normalized form $\bar{\theta}$ wherein a relation of the form θ=2πθ̄ applies. System 700 (also referred to herein as a "quadrature modulator") accepts the three inputs and computes an output digital word, here designated as R, where R is related to the inputs by the relationship R=I cos θ+Q sin θ. It can be shown that the value R is also the X coordinate of the point in the (X,Y) plane that is obtained by starting at the point (I, Q) and rotating this point clockwise, around the origin in the (X, y) plane, through the angle θ.

If a sequence of (I, Q) pairs of values is given as an input sequence to system 700, and if an output sequence of values R is produced by rotating each point in the input sequence by a monotone increasing sequence of equally-spaced angles θ, then the result is a well-known form of modulation of a sinusoid whose angular frequency is determined by the specifics of the sequence of angles θ, wherein the data sequence of (I, Q) pairs does the modulating to produce the output sequence of values R. Such a system can have important applications in digital communications applications.

One difficulty that must be overcome in implementing this type of modulation system is that the digital circuitry that performs the R=I cos θ+Q sin θ computation may not operate as fast as desired. In such a situation, one way to deal with the problem is to build M modulation systems, all operating in parallel with one another, and to decompose the input sequence of (I, Q) data pairs into blocks of length M, with one of the M subsystems performing the computations for one of the M input data pairs ($I_k$, $Q_k$). Then, each subsystem can operate at a data rate that is M times slower than the overall system's apparent data rate. It also happens that a sequence of $\theta_k$ values must be distributed in a similar manner among all M subsystems.

Figure 8:
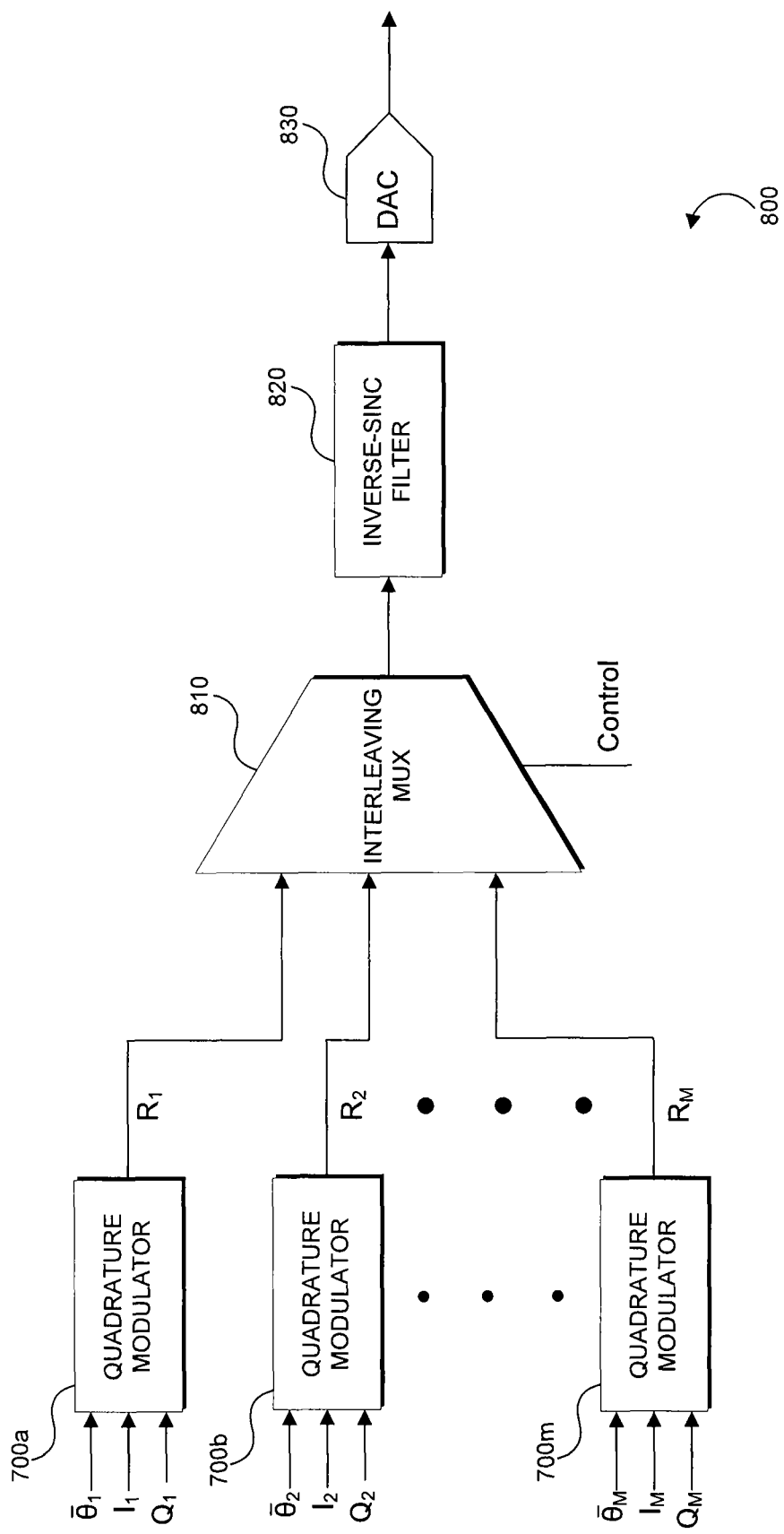
FIG. 8 depicts an exemplary system where M modulator outputs are interleaved using a MUX and then inverse-sinc filtered.

In this type of system, the M outputs can be interleaved by using an appropriately controlled interleaving MUX, as shown in FIG. 8. Specifically, as depicted in FIG. 8, interleaving MUX 810 receives M output data streams from quadrature modulators 700a-m, and produces a single high rate output date stream. The resulting high rate output data stream, provided at the output of interleaving MUX 810, may be M-times faster than each of the M output data streams produced by quadrature modulators 700a-m.

Only interleaving MUX 810 and any components located downstream from it, such as inverse-sinc filter 820 and digital-to-analog converter (DAC) 830, must operate at the M-times higher data rate. When such downstream components include an inverse-sinc filter 820, embodiments of the present invention can overcome the need to operate this filter at the high data rate.

Figure 9:
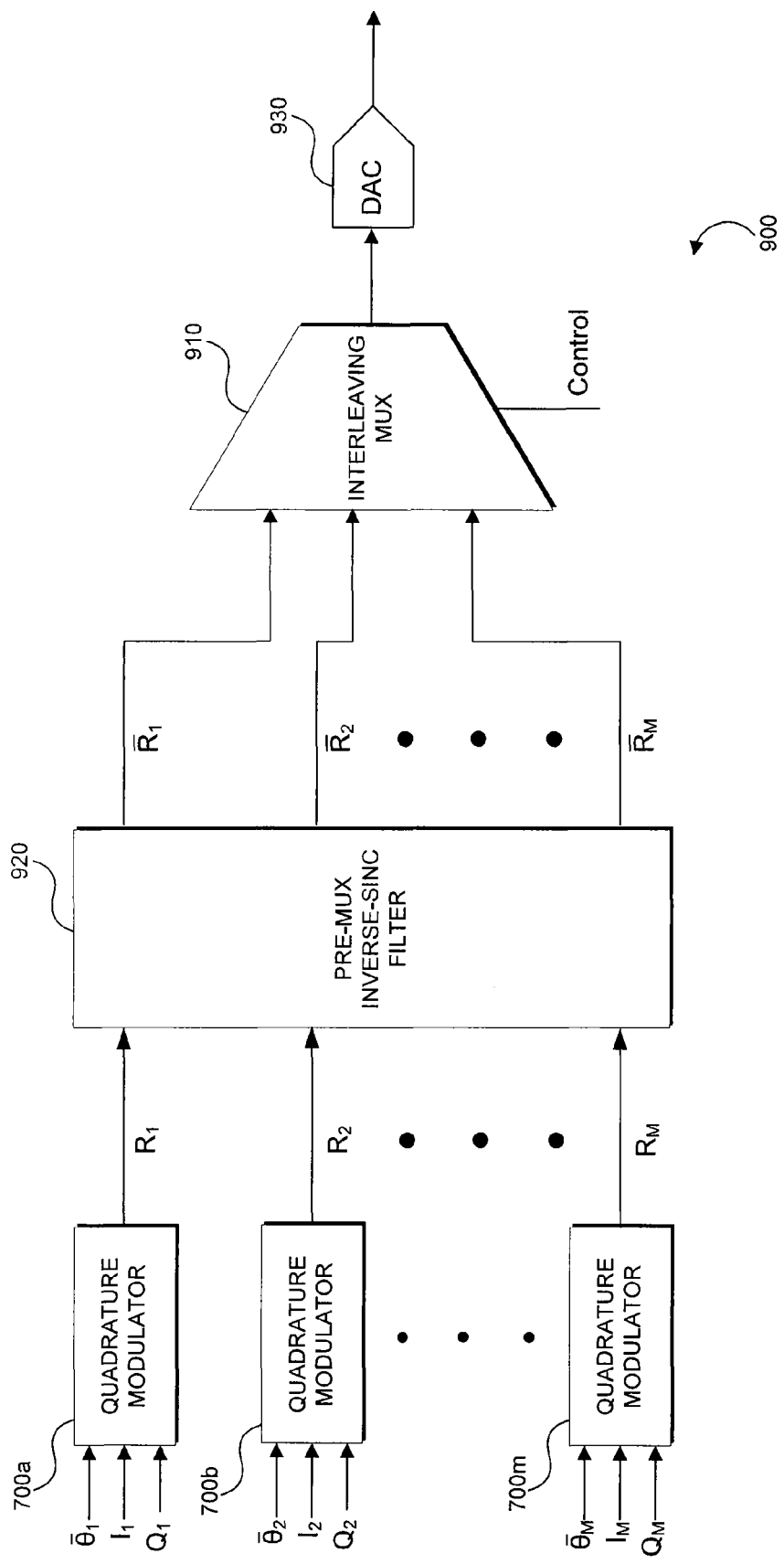
FIG. 9 depicts an exemplary embodiment of a system where M modulator outputs are first processed by a pre-MUX inverse-sinc filter and then interleaved using a MUX, in accordance with the present invention.

This is shown in FIG. 9, where the pre-MUX inverse-sinc filter 920, also referred to herein as an integrated inverse-sinc-module, followed by an interleaving MUX 910 replaces the interleaving MUX followed by a traditional inverse-sinc filter, as shown in FIG. 8.

Figure 7:
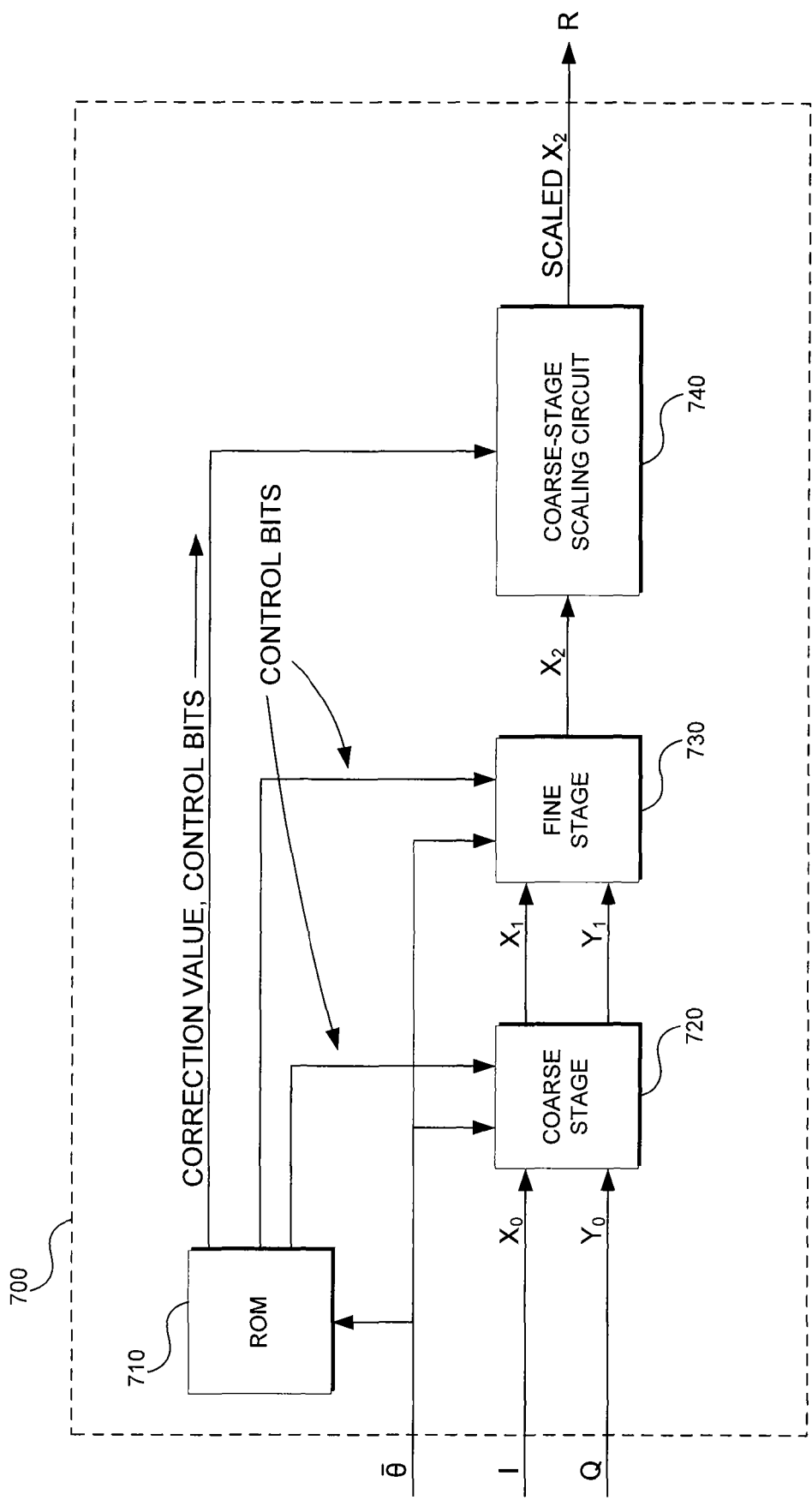
FIG. 7 depicts an embodiment of a quadrature-modulator using an angle rotator.

It should be noted that a further simplification may be realized in a system of M parallel subsystems followed by a pre-MUX inverse-sinc filter, such as system 900 illustrated in FIG. 9. Specifically, when one of the M parallel subsystems employs some form of scaling, such as an output scaling module, portions of the output scaling module may be shared with the pre-MUX inverse-sinc filter. For example, the output scaling module of the k-th subsystem may be shared with the corresponding submodule(s) within the pre-MUX inverse-sinc filter (i.e., the submodule(s) within the pre-MUX inverse-sinc filter that process the output of the k-th subsystem). System 700 of FIG. 7 is one exemplary subsystem that includes an output scaling module 740.

In order to achieve such sharing, the output scaling circuitry may be required to receive some of the overall system's control signals, such as the control signal feeding interleaving MUX 920, as will be appreciated by one of ordinary skill in the art.

Efficient Optimal Scaling

There are situations where it may be advantageous to provide additional scaling for an inverse-sinc filter, and in such situations, the type of system mentioned above, i.e., one in which there is an output scaling module appearing just before the inverse-sinc filter is encountered, provide a good opportunity to do this—perhaps with little or no penalty in terms of additional circuitry or additional power consumption. Such a situation is discussed below.

Suppose the seven-tap inverse-sinc filter discussed herein (the Samueli 7-tap filter, shown in FIG. 2) is employed, having $$h_0 = 1\tfrac{1}{4}, h_1 = -\tfrac{1}{16}, h_2 = \tfrac{1}{64}, h_3 = -\tfrac{1}{256}.$$

For this filter, the maximum gain, in dB, is given by the expression $$20 \log_{10}(|h_0| + 2(|h_1| + |h_2| + |h_3|)).$$

This result is discussed in Samueli. The value of this maximum gain is approximately −0.7801 dB, which means, in fact, that the inverse-sinc filter provides loss at all frequencies. Thus, it is evident that the inverse-sinc filter is causing a less than optimal use of the dynamic range of the input data being fed to the DAC. Since $-0.7801 \approx 20 \log_{10}(0.9141)$ it is clear that the overall system could benefit from the use of an additional output scaling factor of approximately $1/0.9141 = 1.094$. That is, it may be beneficial to scale up the output of the inverse-sinc filter by this factor (almost 10%). Doing this at the high data-rate in a conventional inverse-sinc system could be prohibitive. The use of a pre-MUX inverse-sinc filter system could present the opportunity to perform such scaling at the lower data rate. In fact, simply scaling the data up by this factor as it leaves each of the M subsystems would be all that is required. One more bit may need to be allowed at the high-order end of the words at each subsystem output and for many of the words in the datapath of the pre-MUX inverse-sinc filter. However, the final values that are MUXed to form the high-data-rate input to the DAC will still be representable with whatever wordlength they would have if no inverse-sinc filter was being used.

The use of an inverse-sinc filter at the output of an "Efficient Angle Rotator Configured for Dynamic Adjustment," (U.S. Utility patent application Ser. No. 11/938,252) provides one further opportunity for increased efficiency. The inverse-sinc scaling can be combined with the naturally occurring output-scaling operation and thereby may not even require extra computation. In the Coarse Stage Scaling Circuit 740 at the output of system 700 of FIG. 7, the actual scaling factor is determined by the contents of a ROM 710. By providing an alternate ROM for use when the output is subsequently being processed by an inverse-sinc filter (either a normal one, at the high data-rate, or a pre-MUX inverse-sinc filter) there can be just one multiplication performed. In fact, using an inverse-sinc filter sometimes, and not using one at other times, may be an option by using the normal scaling ROM or the alternate scaling ROM, whichever one is appropriate.

There is another perspective from which the scaling can be viewed, one wherein we improve the capability to design better inverse-sinc filters—resulting in better systems that employ our pre-MUX inverse-sinc filter system. From this perspective, our discussion of scaling is actually a form of re-scaling. As explained in Samueli, the optimal scaling of inverse-sinc filter coefficients specifies coefficients for which the sum of $|h_k|$ over all filter taps equals 1. By using other tap-coefficient scaling factors, wherein this sum is less than 1, overflows are avoided and it becomes possible, at the system design stage, by searching through the coefficient values while various scaling factors are tried, to find a set of coefficient values that can be implemented in hardware more cheaply. The cost of such scaling can be the loss of some dynamic range at the input to the DAC, and we have examined a case (the Samueli 7-tap filter) wherein this loss of dynamic range is approximately 10%.

It is desirable to keep this loss of dynamic range to a minimum. If we can achieve optimal scaling, through a "re-scaling" compensation for the non-optimal scaling factor, and if this re-scaling can be done at little or no cost, as explained above, by including a scaling (re-scaling) factor in the processing being done in the sub-systems being interleaved, especially by exploiting the essentially zero-cost alternate-ROM scaling for interleaved modulators, as we have described, we achieve the ideal situation of having the freedom to design the best inverse-sinc filters and to also have minimal, even zero, loss in dynamic range at the DAC input.

Cascading Two Pre-MUX Inverse-Sinc Modules

Figure 10:
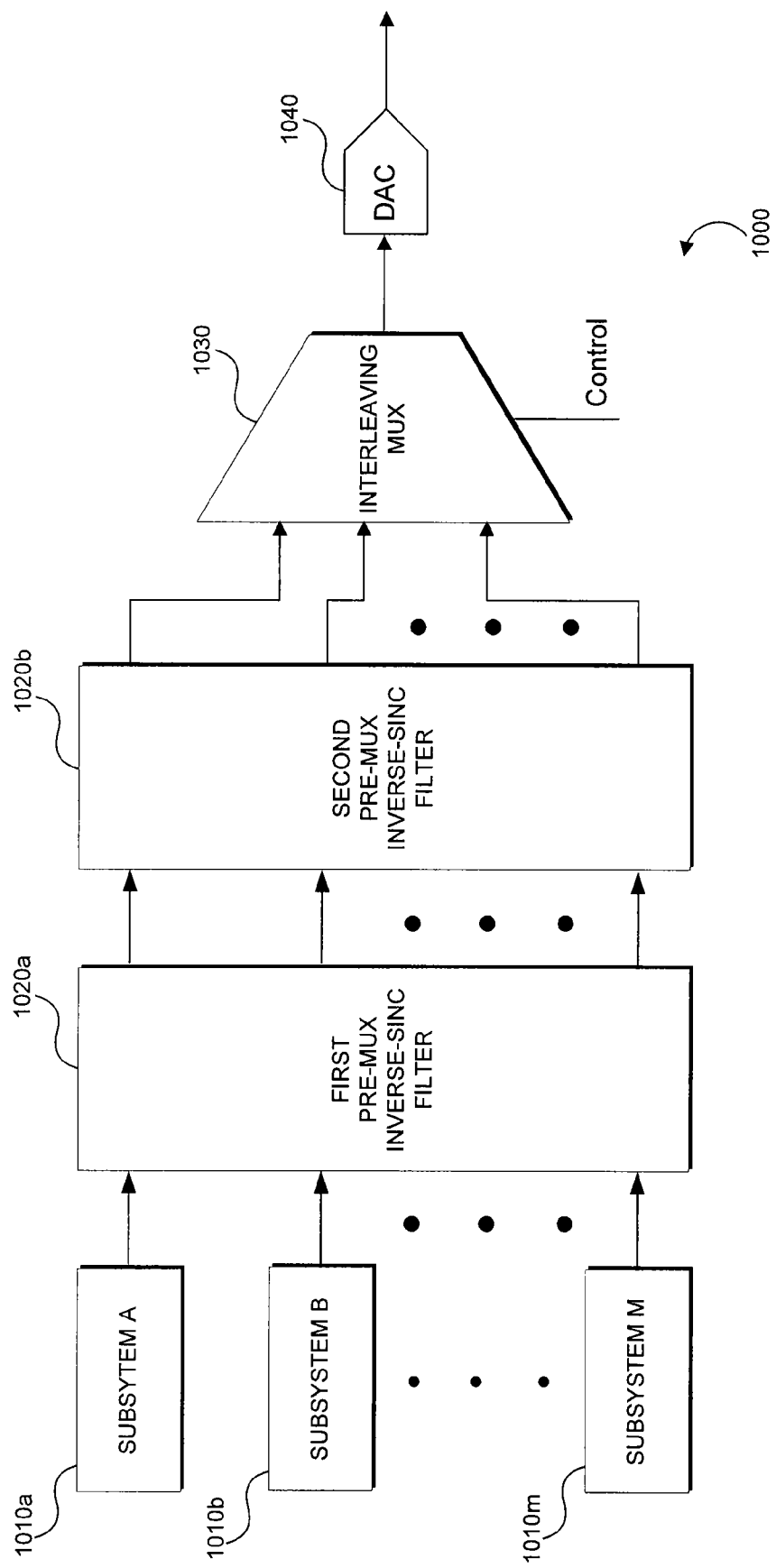
FIG. 10 depicts an exemplary embodiment of a system where M modulator outputs are first processed by two, cascaded pre-MUX inverse-sinc filters and then interleaved using a MUX, in accordance with the present invention.

FIG. 10 depicts exemplary system 1000, in accordance with the present invention. System 1000 includes M subsystems 1010a-m, first pre-MUX inverse-sinc filter 1020a, second pre-MUX inverse-sinc filter 1020b, interleaving MUX 1030, and DAC 1040. First and second pre-MUX inverse-sinc filters 1020a and 1020b have been created by decomposing a single (post-MUX) inverse-sinc filter into a product of a first filter and a second filter. Each pre-MUX inverse-sinc filter, i.e., 1020a and 1020b, has been constructed in accordance with the present invention (e.g., module 300 of FIG. 3, module 400 of FIG. 4, and module 500 of FIG. 5), to be equivalent to said first filter and second filter, respectively. The single pre-MUX inverse-sinc filter comprising the cascaded system of the first and second pre-MUX inverse-sinc filters, 1020a and 1020b, is equivalent to a pre-MUX inverse-sinc filter, constructed in accordance with the present invention, for said single (post-MUX) inverse-sinc filter.

Figure 11:
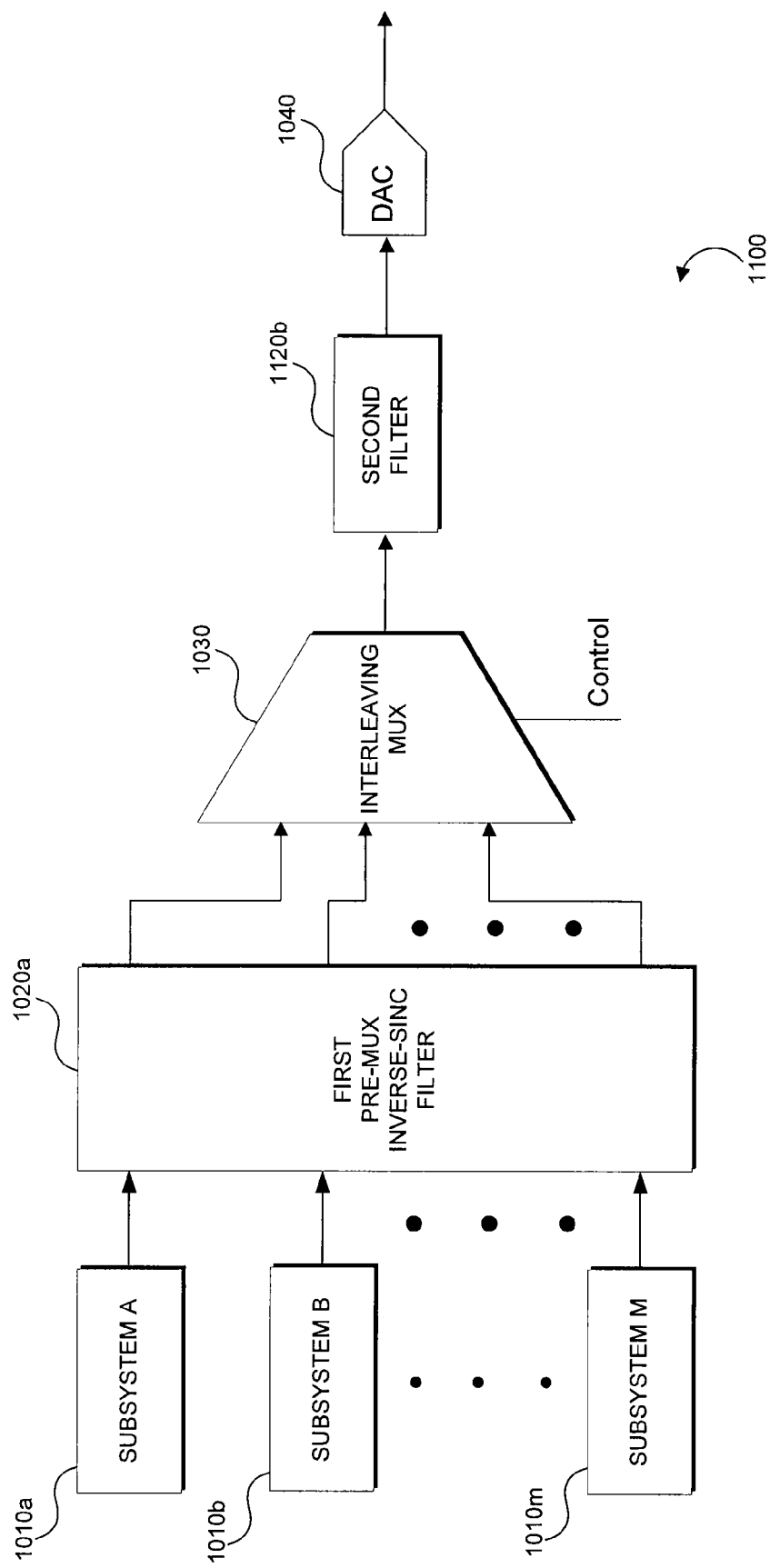
FIG. 11 depicts an exemplary embodiment of a system where M modulator outputs are first processed by a pre-MUX inverse-sinc filter, then interleaved using a MUX, and further processed by a second filter, in accordance with the present invention.

Furthermore, it follows from the equivalence of the systems shown in FIGS. 8 and 9 that it is possible to eliminate the second pre-MUX inverse-sinc filter 1020b of FIG. 10 and, as shown in FIG. 11, insert said second filter 1120b after the MUX, to construct a system equivalent to that of FIG. 10.

Figure 12:
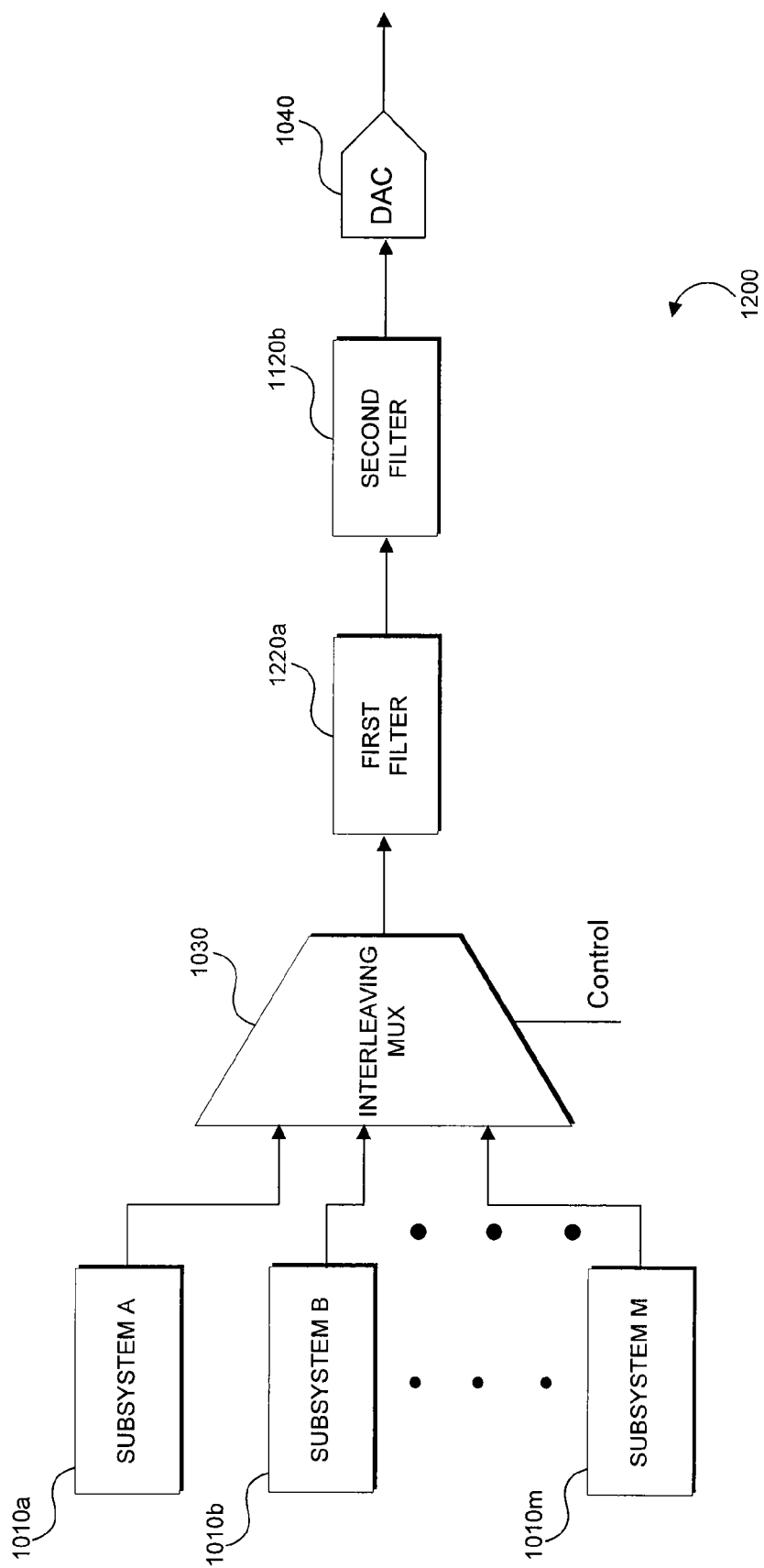
FIG. 12 depicts an exemplary embodiment of a system where M modulator outputs are first interleaved using a MUX, and then further processed by two cascaded filters, in accordance with the present invention.

It is now further apparent from FIG. 11 that first pre-MUX inverse-sinc filter 1020a can be removed and replaced by said first filter. System 1200 of FIG. 12 depicts an exemplary embodiment of this possibility, in accordance with the present invention. First filter 1220a replaces first pre-MUX inverse-sinc filter 1020a illustrated in FIG. 11.

It will be obvious to one of ordinary skill in the art that a desired inverse-sinc filter may be decomposed into a cascade of any number of filters, and is not limited to two. It will be further obvious to one of ordinary skill in the art that the embodiments of FIGS. 10, 11, and 12 may be readily extended to incorporate any number of filters in cascade that result from the decomposition of a desired inverse-sinc filter.

III. Exemplary Computer System

Figure 13:
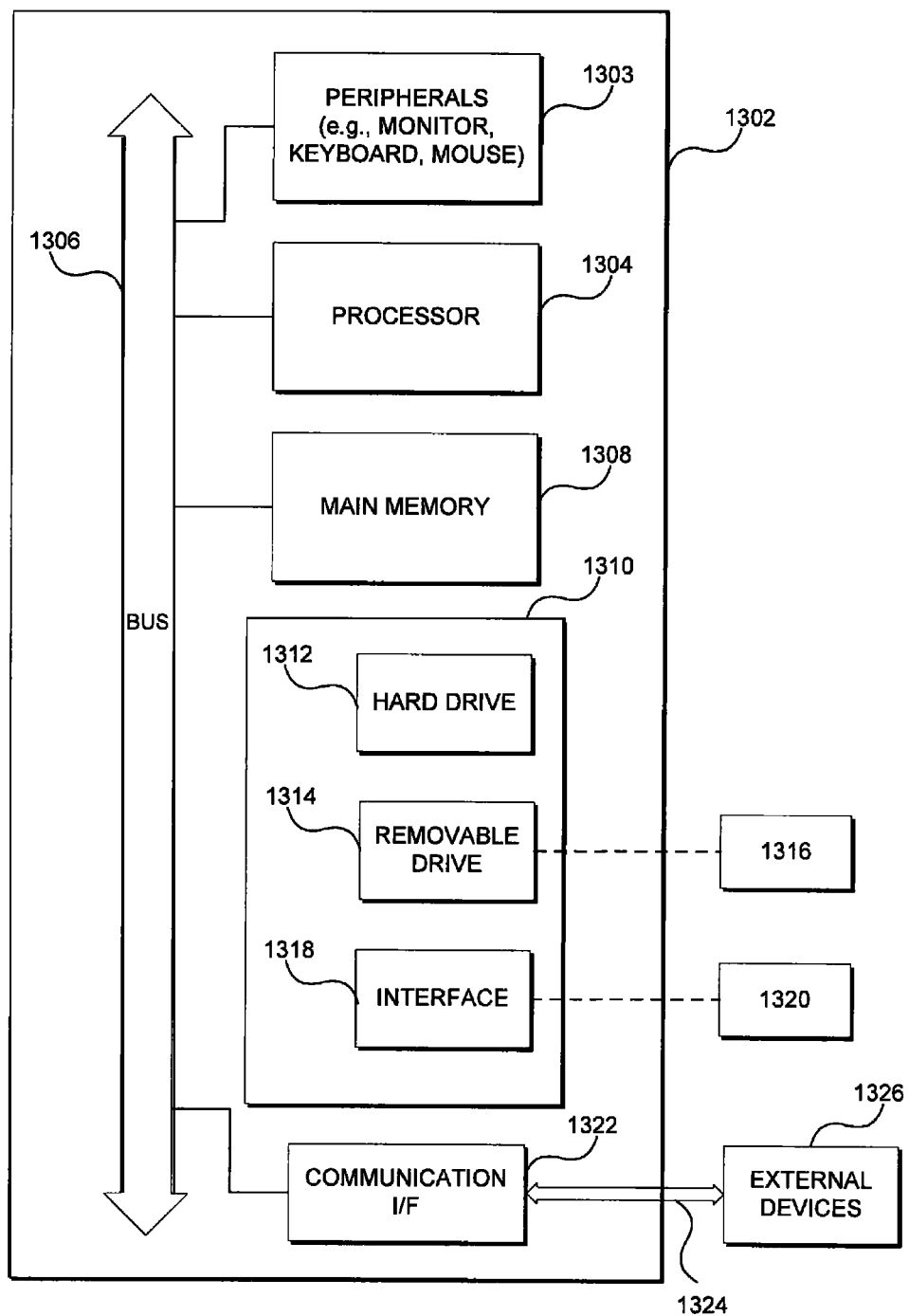
FIG. 13 depicts an exemplary computer system, according to embodiments of the present invention.

Embodiments of the present invention may be implemented using hardware, software or a combination thereof and may be implemented in a computer system or other processing system. In fact, in one embodiment, the invention is directed toward a software and/or hardware embodiment in a computer system. An example computer system 1302 is shown in FIG. 13. The computer system 1302 includes one or more processors, such as processor 1304. The processor 1304 is connected to a communication bus 1306. The invention can be implemented in various software embodiments that can operate in this example computer system. After reading this description, it will become apparent to a person skilled in the relevant art how to implement the invention using other computer systems and/or computer architectures.

Computer system 1302 also includes a main memory 1308, preferably a random access memory (RAM), and can also include a secondary memory or secondary storage 1310. The secondary memory 1310 can include, for example, a hard disk drive 1312 and a removable storage drive 1314, representing a floppy disk drive, a magnetic tape drive, an optical disk drive, etc. The removable storage drive 1314 reads from and/or writes to a removable storage unit 1316 in a well known manner. Removable storage unit 1316, represents a floppy disk, magnetic tape, optical disk, etc. which is read from, and written to, by removable storage drive 1314. As will be appreciated, the removable storage unit 1316 includes a computer usable storage medium having stored therein computer software and/or data.

In alternative embodiments, secondary memory 1310 may include other similar means for allowing computer software and data to be loaded into computer system 1302. Such means can include, for example, a removable storage unit 1320 and a storage interface 1318. Examples of such can include a program cartridge and cartridge interface (such as that found in video game devices), a removable memory chip (such as an EPROM, or PROM) and associated socket, and other removable storage units 1320 and interfaces 1318 which allow software and data to be transferred from the removable storage unit 1320 to the computer system 1302.

Computer system 1302 can also include a communications interface 1322. Communications interface 1322 allows software and data to be transferred between computer system 1302 and external devices 1326. Examples of communications interface 1322 can include a modem, a network interface (such as an Ethernet card), a communications port, a PCMCIA slot and card, etc. Software and data transferred via communications interface 1322 are in the form of signals, which can be electronic, electromagnetic, optical or other signals capable of being received by the communications interface 1322. These signals are provided to the communications interface 1322 via a channel 1324. This channel 1324 can be implemented using wire or cable, fiber optics, a phone line, a cellular phone link, an RF link and other communications channels.

Computer system 1302 may also include well known peripherals 1303 including a display monitor, a keyboard, a printer and facsimile, and a pointing device such a computer mouse, track ball, etc. In this document, the terms "computer program medium" and "computer usable medium" are used to generally refer to media such as the removable storage devices 1316 and 1320, a hard disk installed in hard disk drive 1312, and semiconductor memory devices including RAM and ROM. These computer program products are means for providing software (including computer programs that embody the invention) and/or data to computer system 1302.

Computer programs (also called computer control logic or computer program logic) are generally stored in main memory 1308 and/or secondary memory 1310 and executed therefrom. Computer programs can also be received via communications interface 1322. Such computer programs, when executed, enable the computer system 1302 to perform the features of the present invention as discussed herein. In particular, the computer programs, when executed, enable the processor 1304 to perform the features of the present invention. Accordingly, such computer programs represent controllers of the computer system 1302.

In an embodiment where the invention is implemented using software, the software may be stored in a computer program product and loaded into computer system 1302 using removable storage drive 1314, hard drive 1312 or communications interface 1322. The control logic (software), when executed by the processor 1304, causes the processor 1304 to perform the functions of the invention as described herein.

In another embodiment, the invention is implemented primarily in hardware using, for example, hardware components such as application specific integrated circuits (ASICs), stand alone processors, and/or digital signal processors (DSPs). Implementation of the hardware state machine so as to perform the functions described herein will be apparent to persons skilled in the relevant art(s). In embodiments, the invention can exist as software operating on these hardware platforms.

In yet another embodiment, the invention is implemented using a combination of both hardware and software.

CONCLUSION

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A multiple-input, multiple-output system, comprising:
M input ports configured to respectively receive a different one of M discrete-time input signals;
an integrated inverse-sinc hardware module configured to simultaneously process the M discrete-time input signals to generate M discrete-time output signals such that, when the M discrete-time output signals are interleaved to produce a first signal, the first signal, is equivalent to that produced by inverse-sinc filtering, using an inverse sinc filter, a second signal created by interleaving the M discrete-time input signals; and
M output ports configured to respectively provide a different one of the M discrete-time output signals,
wherein the integrated inverse-sinc hardware module comprises only a minimum number of delay elements equal to an order of the inverse-sine filter.

2. The system of claim 1, wherein the integrated inverse-sine hardware module comprises a sub-module coupled to a single one of the M discrete-time input signals, the sub-module configured to generate components for a plurality of the M discrete-time output signals based on the single one of the M discrete-time input signals coupled to the sub-module.

3. The system of claim 2, wherein the components are generated using a shared delay element.

4. The system of claim 2, wherein the integrated inverse-sine hardware module includes M of said sub-modules that are respectively coupled to a different one of the M input signals.

5. The system of claim 1, wherein the integrated inverse-sine hardware module includes a sub-module coupled to a plurality of the M discrete-time input signals.

6. The system of claim 5, wherein the sub-module is configured to compute components for a single one of the M discrete-time output signals.

7. The system of claim 6, wherein the components are summed using at least one of an adder tree and a vector-merge adder.

8. The system of claim 7, wherein the adder tree is at least one of a carry save adder tree and a Wallace tree.

9. The system of claim 7, wherein the sum of the components represents the value of the single one of the M discrete-time output signals at a discrete point in time.

10. The system of claim 9, wherein the integrated inverse-sinc hardware module includes M of said sub-modules that respectively provide the value of a different one of the M discrete-time output signals at a discrete point in time.

11. The system of claim 1, wherein the integrated inverse-sinc hardware module is a finite impulse response (FIR) filter having the transfer function $H(z)=h_3+h_2z^{-1}+h_1z^{-2}+h_0z^{-3}+h_1z^{-4}+h_2z^{-5}+h_3z^{-6}$, wherein $h_0$, $h_1$, $h_2$, and $h_3$ are coefficients that are substantially equal to $3/4$, $-1/16$, $1/64$, $-1/256$, respectively.

12. The system of claim 1, wherein the M discrete-time input signals are provided by a plurality of sub-systems.

13. The system of claim 12, wherein at least one of the sub-systems is a modulator.

14. The system of claim 1, wherein the integrated inverse-sine hardware module is decomposed into a plurality of integrated inverse-sine hardware modules in cascade.

15. The system of claim 1, wherein the system employs a hard-wired bit shift to implement a power-of-two multiplication.

16. A method, comprising:
receiving M discrete-time input signals at respective inputs of a filter;
simultaneously processing the M discrete-time input signals in the filter to generate M discrete-time output signals such that, when the M discrete-time output signals are interleaved to produce a first signal, the first signal is equivalent to that produced by inverse-sine filtering a second signal created by interleaving the M discrete-time input signals; and
providing the M discrete-time output signals at respective outputs of the filter,
wherein simultaneously processing the M discrete-time input signals comprises adding samples to produce a sum, wherein one of the samples is provided by a shared delay element configured to generate, at least in part, components for a plurality of the M discrete-time output signals, and multiplying the sum of the samples using a multiplier.

17. The method of claim 16, wherein each of the M discrete-time output signals is comprised of a sum of components.

18. A system, comprising:
a plurality of sub-systems configured to provide a first set of output signals;
an integrated inverse-sinc hardware module configured to simultaneously process the first set of output signals to generate a second set of output signals; and
an interleaving MUX configured to sequentially couple the second set, of output signals repeatedly to an output of the interleaving MUX to provide an interleaved signal,
wherein the integrated inverse-sine hardware module is configured to generate the second set of output signals such that the interleaved signal is equivalent to that produced by inverse-sine filtering an interleaved sequence of the first set of output signals,
wherein the integrated inverse-sinc hardware module comprises a multiplier configured to multiply a sum of samples from the first set of output signals,
wherein the integrated inverse-sine hardware module comprises a shared delay element configured to provide one of the samples and to generate, at least in part, components for a plurality of the second set of output signals.

19. The system of claim 18, wherein at least one of the sub-systems is a modulator.

20. The system of claim 18, wherein the first set of output signals are scaled before being processed by the integrated inverse-sine hardware module.

21. The system of claim 20, wherein the first set of output signals are scaled to compensate for loss provided by the integrated inverse-sine hardware module.

22. The system of claim 18, wherein the integrated inverse-sine hardware module is decomposed into a plurality of integrated inverse-sinc hardware modules in cascade.

23. A multiple-input, multiple-output system, comprising:
M input ports configured to respectively receive a different one of M discrete-time input signals;
an integrated inverse-sinc hardware module configured to simultaneously process the M discrete-time input signals to generate M discrete-time output signals such that, when the M discrete-time output signals are interleaved to produce a first signal, the first signal is equivalent to that produced by inverse-sine filtering a second signal created by interleaving the M discrete-time input signals; and
M output ports configured to respectively provide a different one of the M discrete-time output signals, wherein the integrated inverse-sine hardware module comprises a multiplier configured to multiply a sum of samples from one of the M discrete-time input signals,
wherein the integrated inverse-sine hardware module comprises a shared delay element configured to provide one of the samples and to generate, at least in part, components for a plurality of the M discrete-time output signals.

24. The system of claim 23, wherein the integrated inverse-sine hardware module comprises a sub-module coupled to a single one of the M discrete-time input signals, the sub-module comprising the multiplier and the shared delay element.

25. The system of claim 23, wherein the M discrete-time input signals are provided by a plurality of sub-systems.

26. The system of claim 25, wherein at least one of the sub-systems is a modulator.

27. The system of claim 23, wherein the integrated inverse-sine hardware module is decomposed into a plurality of inverse-sinc modules in cascade.

28. The system of claim 23, wherein the multiplier is implemented by a hard-wired bit shift.

* * * * *

UNITED STATES PATENT AND TRADEMARK OFFICE
CERTIFICATE OF CORRECTION

PATENT NO.        : 8,694,569 B2                                          Page 1 of 1
APPLICATION NO.   : 12/233422
DATED             : April 8, 2014
INVENTOR(S)       : Alan N. Willson, Jr.

It is certified that error appears in the above-identified patent and that said Letters Patent is hereby corrected as shown below:

In the Claims

Claim 1, Column 13, line 13 please replace "signal, is" with --signal is--.
Claim 1, Column 13, line 21 please replace "inverse-sine" with --inverse-sinc--.
Claim 2, Column 13, line 23 please replace "inverse-sine" with --inverse-sinc--.
Claim 4, Column 13, line 31 please replace "sine" with --sinc--.
Claim 5, Column 13, line 35 please replace "sine" with --sinc--.
Claim 14, Column 13, line 63 please replace "sine" with --sinc--.
Claim 14, Column 13, line 64 please replace "inverse-sine" with --inverse-sinc--.
Claim 16, Column 14, line 8 please replace "inverse-sine" with --inverse-sinc--.
Claim 16, Column 14, line 30 please replace "set, of" with --set of--.
Claim 16, Column 14, line 32 please replace "inverse-sine" with --inverse-sinc--.
Claim 16, Column 14, line 35 please replace "inverse-sine" with --inverse-sinc--.
Claim 16, Column 14, line 40 please replace "inverse-sine" with --inverse-sinc--.
Claim 20, Column 14, line 48 please replace "inverse-sine" with --inverse-sinc--.
Claim 21, Column 14, line 51 please replace "inverse-sine" with --inverse-sinc--.
Claim 23, Column 14, line 58 please replace "inverse-sine" with --inverse-sinc--.
Claim 23, Column 14, line 63 please replace "inverse-sine" with --inverse-sinc--.
Claim 23, Column 15, line 1 please replace "inverse-sine" with --inverse-sinc--.
Claim 23, Column 15, line 4 please replace "inverse-sine" with --inverse-sinc--.
Claim 24, Column 15, line 10 please replace "sine" with --sinc--.
Claim 27, Column 15, line 20 please replace "inverse-sine" with --inverse-sinc--.

Signed and Sealed this
Twenty-second Day of July, 2014

Michelle K. Lee
*Deputy Director of the United States Patent and Trademark Office*